United States Patent
Jang et al.

(10) Patent No.: US 10,330,709 B2
(45) Date of Patent: Jun. 25, 2019

(54) METHOD AND SYSTEM FOR ESTIMATING RMS OF AC VOLTAGE

(71) Applicant: Hyundai Motor Company, Seoul (KR)

(72) Inventors: Hui Sung Jang, Gyeonggi-do (KR); Gi Bong Son, Gyeonggi-Do (KR); Hyun Wook Seong, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 207 days.

(21) Appl. No.: 15/262,823

(22) Filed: Sep. 12, 2016

(65) Prior Publication Data

US 2017/0343588 A1 Nov. 30, 2017

(30) Foreign Application Priority Data

May 24, 2016 (KR) .................. 10-2016-0063201

(51) Int. Cl.
*G01R 19/02* (2006.01)
*G01R 19/22* (2006.01)
*G01R 19/25* (2006.01)

(52) U.S. Cl.
CPC .............. *G01R 19/02* (2013.01); *G01R 19/22* (2013.01); *G01R 19/2506* (2013.01)

(58) Field of Classification Search
CPC ..... G01R 19/02; G01R 19/22; G01R 19/2506
See application file for complete search history.

(56) References Cited

U.S. PATENT DOCUMENTS

| 3,795,868 A * | 3/1974 | Ohme .................... G01R 19/02 324/132 |
| 2004/0249876 A1* | 12/2004 | Tuladhar ................ G01R 19/02 708/490 |
| 2007/0069663 A1* | 3/2007 | Burdalski .......... H05B 33/0803 315/312 |
| 2010/0079077 A1* | 4/2010 | Imam .................... H05B 39/08 315/224 |
| 2012/0016531 A1* | 1/2012 | Ganev ..................... H02H 3/00 700/293 |
| 2012/0120700 A1* | 5/2012 | Elberbaum .......... H02M 1/081 363/128 |

FOREIGN PATENT DOCUMENTS

| JP | 2003-270277 A | 9/2003 |
| JP | 2010-169600 A | 8/2010 |
| JP | 2015-215195 A | 12/2015 |
| KR | 10-1999-0000245 A | 1/1999 |
| KR | 10-1620036 B1 | 5/2016 |

\* cited by examiner

*Primary Examiner* — Stephanie E Bloss
(74) *Attorney, Agent, or Firm* — Mintz Levin Cohn Ferris Glovsky and Popeo, P.C.; Paul F. Corless

(57) ABSTRACT

A method of estimating a root mean square (RMS) of an alternating current (AC) voltage is provided. The system includes a rectifier configured to rectify the AC voltage and a controller configured to derive a delayed AC voltage by delaying the rectified AC voltage by a preset delay time. The controller is configured to estimate a root mean square (RMS) of the AC voltage based on the rectified AC voltage and the delayed AC voltage.

6 Claims, 5 Drawing Sheets

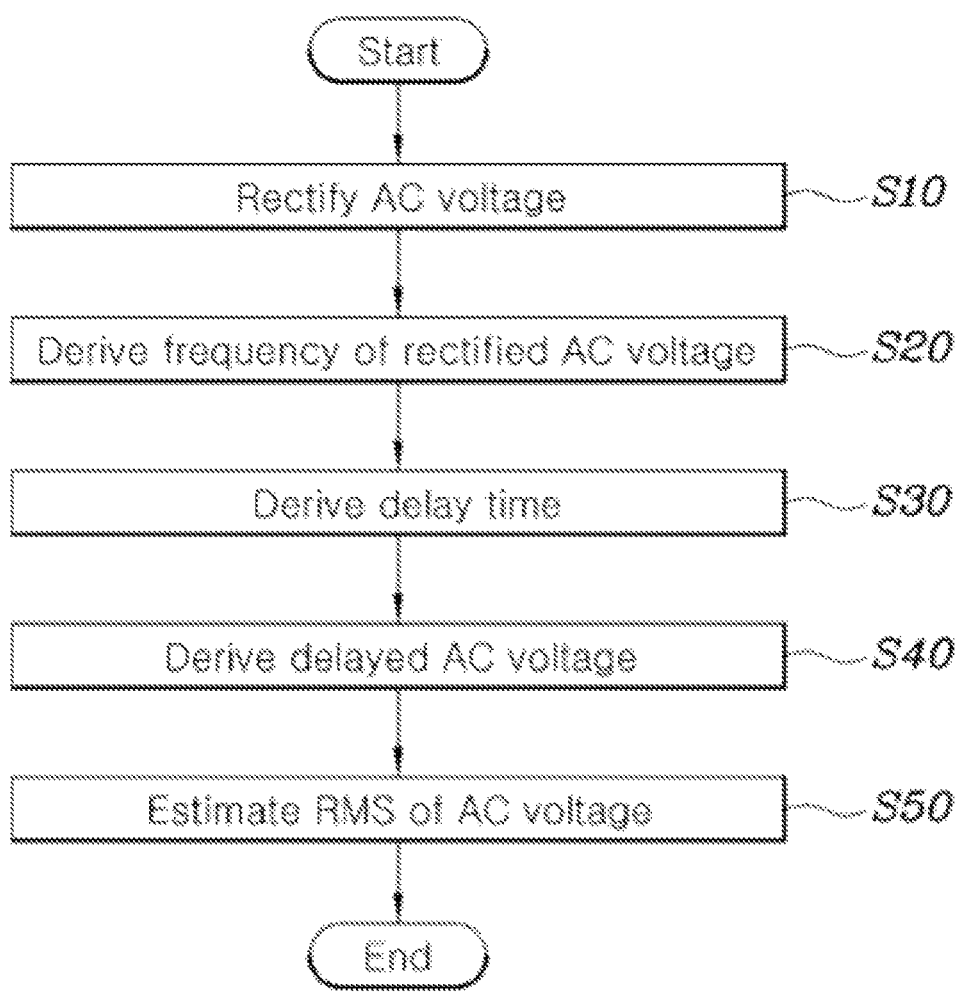

Present invention (a) Comparison of RMS estimation response performance according to prior art and present invention Prior art    Present invention (b) Comparison of RMS ripple according to prior art and present invention

METHOD AND SYSTEM FOR ESTIMATING RMS OF AC VOLTAGE

CROSS-REFERENCE TO RELATED APPLICATION

This application claims priority to Korean Patent Application No. 10-2016-0063201, filed on May 24, 2016 in the Korean Intellectual Property Office, the disclosure of which is incorporated herein by reference.

BACKGROUND

1. Field of the Invention

The present invention relates to a method and system for estimating a root mean square (RMS) of an alternating current (AC) voltage, and more particularly, for rapidly and accurately estimating the RMS of the AC voltage to operate various devices using the RMS.

2. Description of the Related Art

Typically, AC is used for home appliances since AC has higher efficiency than direct current (DC) in terms of power and provides superior user safety compared to DC. Therefore, many electric devices, as well as home appliances currently use AC (except for batteries). In addition, eco-friendly vehicles include hybrid vehicles, plugin hybrid vehicles, electric vehicles, and fuel cell vehicles. In particular, plugin hybrid vehicles and electric vehicles are rechargeable by a power for home use and are equipped with an on-board charger.

The on-board charger mounted within a vehicle uses an AC voltage for high-voltage battery charging of the vehicle. In other words, an RMS value of the AC voltage is required to be calculated to operate the on-board charger mounted within the vehicle using the AC voltage and to prevent failure of the on-board charger. For example, the RMS of the AC voltage enables determination of whether the AC voltage is within a normal operational range and provides implementation of various functions including output limitation.

Various methods for calculating the RMS value of the AC voltage have been proposed. For example, a method of the related art teaches a mean current value into an RMS current voltage according to a conduction angle in a control device to adjust an output current amount by adjusting a firing angle of a Thyristor. Accordingly, the accuracy of detection of the RMS value of an AC voltage is improved. However, when the above method is used, a conventional RMS estimation method uses a filter to calculate a mean of a rectified AC voltage by reducing a ripple value and to calculate an RMS value through average scaling. Thus, response performance is delayed due to use of the filter and a rapid response cannot be secured.

The matters disclosed in this section are merely for enhancement of understanding of the general background of the invention and should not be taken as an acknowledgment or any form of suggestion that the matters form the related art already known to a person skilled in the art.

SUMMARY

Therefore, the present invention provides a method and system for estimating an RMS of an AC voltage, capable of rapidly and more accurately estimating the RMS of the AC voltage to adjust a device using the AC voltage and for device failure prevention.

In accordance with an exemplary embodiment, a method of estimating a root mean square (RMS) of an alternating current (AC) voltage, may include rectifying, by a rectifier, the AC voltage, deriving, by a controller, a delayed AC voltage by delaying the rectified AC voltage by a preset delay interval, and estimating, by the controller, a root mean square (RMS) of the AC voltage using the rectified AC voltage and the delayed AC voltage.

After rectifying the AC voltage, the method may further include scaling, by the controller, the rectified AC voltage a number of times equal to a preset constant. The deriving the delayed AC voltage may include deriving, by the controller, a frequency of the rectified AC voltage, deriving, by the controller, a delay interval using the frequency, and deriving, by the controller, the delayed AC voltage by delaying the rectified AC voltage by the delay time. The deriving of the delay time may include driving the delay time using an equation: $T_d = 1/(4*F_{AC})$ where $T_d$ is the delay interval and $F_{AC}$ is the frequency of the rectified AC voltage. The estimating the RMS of the AC voltage may include deriving, by the controller, the square of the delayed AC voltage and the square of the rectified AC voltage, multiplying, by the controller, the square of the delayed AC voltage by the square of the rectified AC voltage and estimating, by the controller, the RMS of the AC voltage by multiplying a preset transform constant by the multiplied result. The transform constant may be $\sqrt{2}$. The estimating the RMS of the AC voltage may include estimating the RMS of the AC voltage using an equation indicated below: $V_{RMS} = \sqrt{(2*(V_{AC}^2 * (V_{AC} \angle 45°)^2))}$ where $V_{RMS}$ is the estimation value of the RMS of the AC voltage and $V_{AC}$ is the rectified AC voltage.

In accordance with another aspect, a system for estimating a root mean square (RMS) of an alternating current (AC) voltage may include an AC voltage supply configured to supply the AC voltage, a rectifier configured to rectify the AC voltage and a controller configured to derive a delayed AC voltage by delaying the rectified AC voltage by a preset delay time and to estimate the RMS of the AC voltage using the rectified AC voltage and the delayed AC voltage. The controller may further be configured to estimate the RMS of the AC voltage using an equation, $V_{RMS} = \sqrt{(2*(V_{AC}^2 * (V_{AC} \angle 45°)^2))}$ where $V_{RMS}$ is the estimation value of the RMS of the AC voltage and $V_{AC}$ is the rectified AC voltage.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an exemplary flowchart of a method of estimating an RMS of an AC voltage according to an exemplary embodiment of the present invention;

DETAILED DESCRIPTION

Figure 2A:
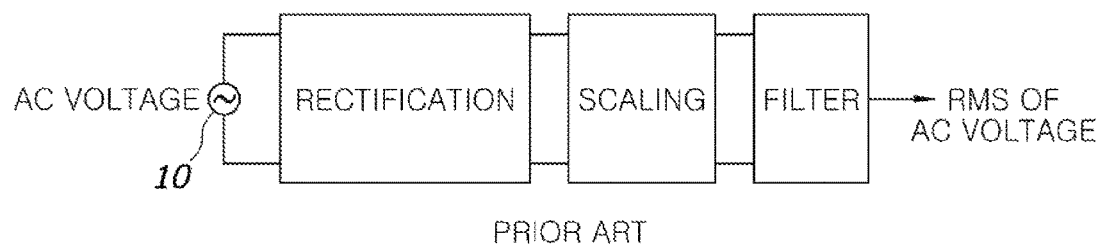
FIG. 2A is an exemplary diagram illustrating comparison of methods of estimating an RMS of an AC voltage according to the related art.

The present invention will be described more fully hereinafter with reference to the accompanying drawings, in which exemplary embodiments of the invention are shown. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

A part irrelevant to the description will be omitted to clearly describe the present disclosure, and the same or similar constituent elements will be designated by the same reference numerals throughout the specification. Terms or words used in the specification and the claims should not be interpreted as being limited to a general or dictionary meaning and should be interpreted as a meaning and a concept which conform to the technical spirit of the present disclosure based on a principle that an inventor can appropriately define a concept of a term in order to describe his/her own disclosure by the best method.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

The present invention provides a method of accurately estimating an RMS, (e.g., an effective value) of an AC voltage 10. The method may include as illustrated in FIG. 1, rectifying the AC voltage by a rectifier 20 (S10), deriving a frequency of the rectified AC voltage 10 by a controller 30 (S20), deriving a delay time using the frequency by the controller (S30), and deriving a delayed AC voltage by delaying the rectified AC voltage by the delay time by the controller 30 (S40).

Rectification of the AC voltage 10 (S10) may be performed by various rectification schemes. Generally, a method of rectifying the AC voltage 10 may include a full-bridge or a half-bridge circuit. In particular, after rectifying the AC voltage 10 (S10), the controller 30 may be configured to perform scaling of the rectified AC voltage 10 a number of times equal to a preset constant. The preset constant may improve accuracy of RMS estimation and may adjust the magnitude of the rectified AC voltage 10 to derive an RMS of the AC power 10 by an adjustment to the rectified AC voltage. Therefore, the preset constant may have various values based on the designer demand or a value of the AC voltage 10.

The deriving of the frequency of the rectified AC voltage 10 (S20) may include deriving the frequency of the AC voltage 10 rectified through rectification of the AC voltage 10 (S10). Generally, when the AC voltage 10 is rectified, the frequency of the rectified AC voltage 109 may be increased (e.g., doubled). For example, when the AC voltage 10 is about 60 Hz prior to rectification, the frequency of the rectified AC voltage may be about 120 Hz. After deriving the frequency of the rectified AC voltage 10, the delay time using the frequency by the controller (S30) may be derived. In other words, the delay time occurs since the RMS estimation does not correspond to in real time a variation in the AC voltage 10 which varies over time.

Figure 2B:
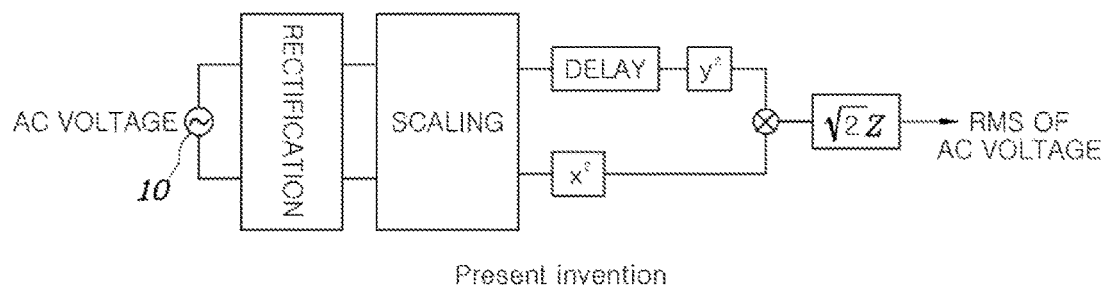
FIG. 2B is an exemplary diagram illustrating comparison of methods of estimating an RMS of an AC voltage according to an exemplary embodiment of the present invention.

As shown in FIGS. 2A and 2B, the delay time may be represented by a comparison between a method of estimating an RMS of the AC voltage 10 according to the prior art and according to the present invention. Referring to FIG. 2A according to the related art, a filter is used in estimating the RMS of the AC voltage 10. When the filter is used, a response time is necessarily delayed by a time constant of the filter. The time constant may be minimized by adjusting values of impedance values of the filter. However, since reduction of the time constant deteriorates performance of the filter, the time constant should be adjusted within the range of maintaining filter performance desired by a designer.

As a result, minimization of the time delay through adjustment of the time constant value has a limit at which the time constant cannot be further reduced. Conversely, according to the exemplary embodiment as illustrated in FIG. 2B, the filter is not required. Thus, a response time delay caused by the filter as in the related art may be prevented and response performance of estimation of the RMS of the AC voltage 10 may be improved. Additionally, the exemplary embodiment may include an operation that compensates for the delay time attributed to a response delay following performance scaling of the rectified AC voltage 10 as illustrated in FIG. 2B. An, an operation prior to deriving the RMS of the AC voltage 10 after scaling of the rectified AC voltage 10 as illustrated in FIG. 2B will be described later.

When compared with the related art in which the filter is provided and a configuration for compensating for the delay time is not included, the exemplary embodiments may significantly improve the response performance of RMS estimation. Improvement in response performance of RMS estimation according to the exemplary embodiment will be described later.

In particular, the delay interval (S30), may be derived using the frequency of the rectified AC voltage 10. Specifically, the delay interval may be derived using by:

$$T_d = 1/(4 * F_{AC}).$$

wherein, $T_d$ is the delay interval and $F_{AC}$ is the frequency of the rectified AC voltage 10.

After the delay interval is derived, the delayed AC voltage 10 may be derived using the derived delay interval. In other words, the delayed AC voltage 10 may be derived by delaying the rectified AC voltage 10 by the derived delay time. For example, when the frequency of the rectified AC voltage 10 is $F_{AC}$, the period of the rectified AC voltage 10 may be $1/F_{AC}$ and the delayed AC voltage 10 may be derived by shifting a graph showing a voltage based on the time of the AC voltage with a period of $1/F_{AC}$ by the derived delay interval on a time axis.

When the delayed AC voltage 10 is derived using the delay time, the controller may be configured to estimate the RMS of the AC voltage (S50) based on the rectified AC voltage 10 and the delayed AC voltage 10 as illustrated in FIG. 1. Specifically, estimation of the RMS of the AC voltage 10 (S50) may include deriving, by the controller 30 the square of the delayed AC voltage and the square of the rectified AC voltage, multiplying, by the controller 30, the square of the delayed AC voltage 10 by the square of the rectified AC voltage 10, and estimating, by the controller 30, the RMS of the AC voltage by multiplying a preset transform constant by the multiplied result. The above operation is briefly illustrated in FIG. 2B as described above.

Specifically, in FIG. 2B, a control operation of "DELAY" block may indicate deriving the delayed AC voltage 10. A control operation of "y²" block may indicate deriving the square of the delayed AC voltage 10. A control operation of "x²" block may indicate deriving the square of the rectified AC voltage 10. A control operation of "X" block may indicate multiplying the square of the delayed AC voltage 10 by the square of the rectified AC voltage 10. A control operation of "$\sqrt{2}N$" may indicate an estimation of the RMS of AC voltage 10 by multiplying the preset transformation constant by the multiplied result.

As illustrated in FIG. 2B, the preset transformation constant is $\sqrt{2}$. For example, the magnitude of a maximum value of the AC voltage 10 is $\sqrt{2}$ times the RMS of the AC voltage. However, since the AC voltage is based on assumption of a normal commercial power voltage, when a particular type of the AC voltage is used, the transformation constant value may be adjusted.

Therefore, an estimation value of the RMS of the AC voltage 10 according to the present invention in a normal case may be indicated as follows upon considering the configuration of FIG. 2B:

$$V_{RMS} = \sqrt{(2*(V_{AC}^2 * (V_{AC} \angle 45°)^2))}.$$

Wherein $V_{RMS}$ is the estimation value of the RMS of the AC voltage 10 and $V_{AC}$ is the rectified AC voltage 10.

In the above equation, $V_{AC} \angle 45°$ may indicate the delayed AC voltage 10. Namely, a phase value is 45° may be the delay interval derived as $1/(4*F_{AC})$ as described previously. When the delay time is derived as $1/(2*F_{AC})$, the phase value may be 90°. Although the phase value may be adjusted based on a design scheme of a designer, a simulation result may represent that deriving the delay time as $1/(4*F_{AC})$ in estimating the RMS is the most effective for response performance and accuracy of RMS estimation. Therefore, the delay time may be derived as $1/(4*F_{AC})$.

Figure 3A:
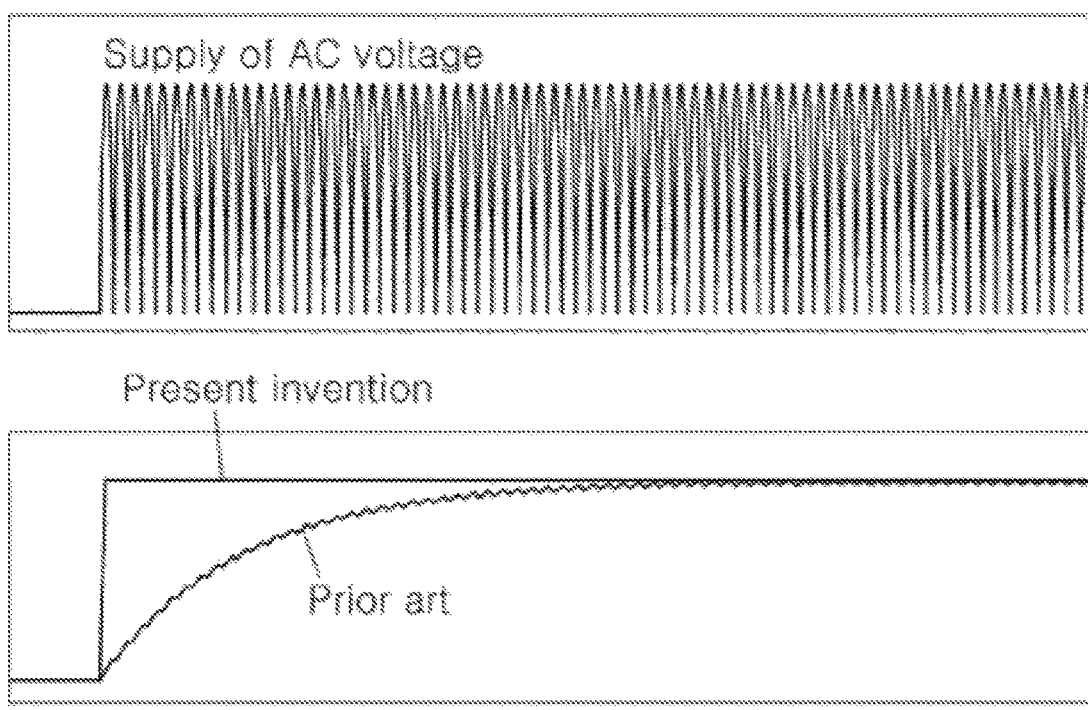
FIG. 3A is an exemplary graph illustrating comparison of RMS estimation response performance and ripple according to the related art and an exemplary embodiment of the present invention.
Figure 3B:
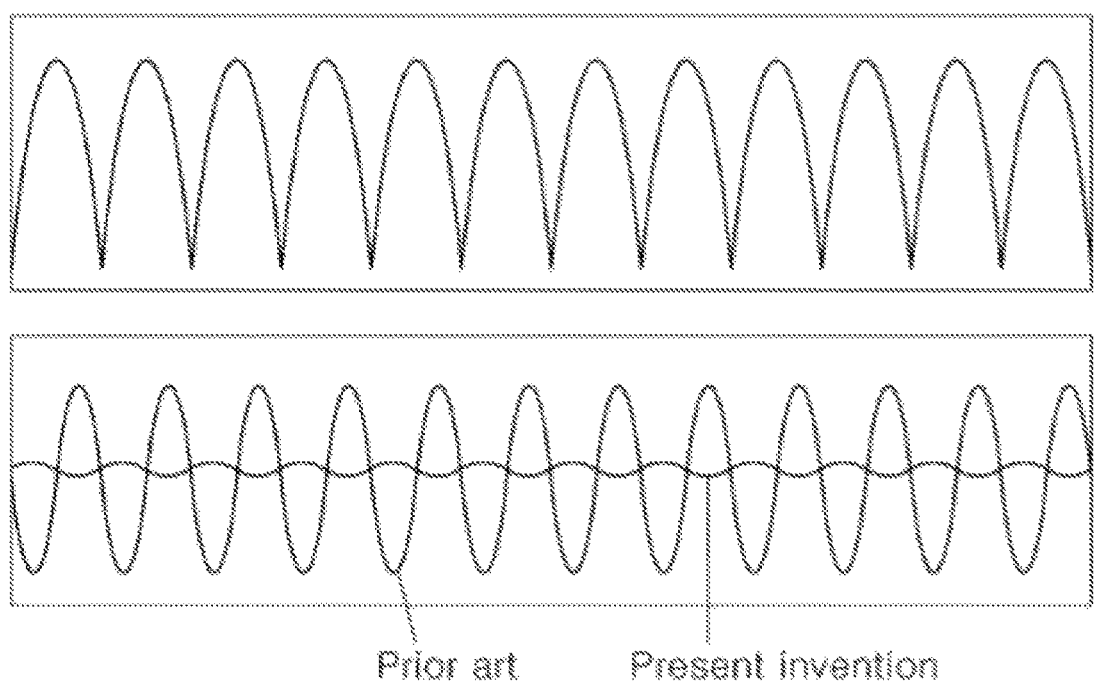
FIG. 3B is an exemplary graph illustrating comparison of RMS estimation response performance and ripple according to related art and an exemplary embodiment of the present invention.

Referring to FIGS. 3A and 3B, response performance and accuracy (ripple) of the RMS estimation method according to the present invention are compared with those according to the related art. In particular, the exemplary embodiments may have an improved response performance compared to the related art. According to the present invention, the RMS of the AC voltage may be derived at a simultaneously as supply of the AC voltage 10. Conversely, the related art reaches the RMS of the AC voltage over an extended time period.

Additionally, in comparison between RMS ripples based on the related art and the present invention, the related art includes a significant amplitude variation relative to a graph showing the rectified AC voltage 10 (e.g., an upper graph of FIG. 3B). According to the exemplary embodiments, ripple component may be significantly reduced and the estimate of the RMS of the AC voltage may be improved. Therefore, the exemplary embodiments may improve the response performance of estimation of the RMS of the AC voltage and may improve the accuracy relative to the related art as illustrated in the graphs of FIGS. 3A and 3B.

Figure 4:
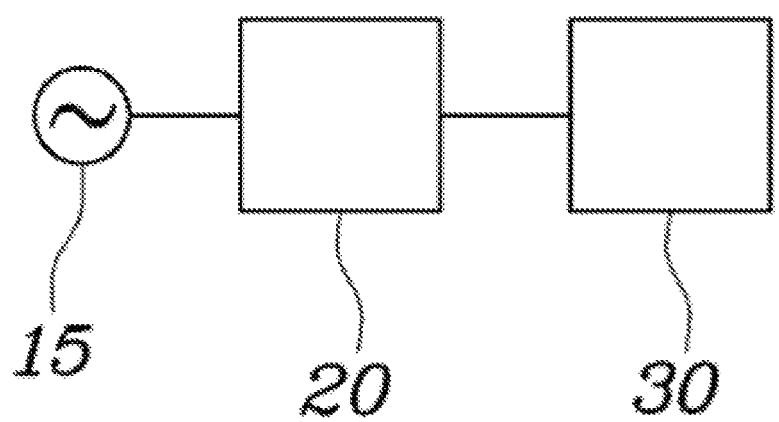
FIG. 4 is a diagram illustrating the configuration of a system for estimating an RMS of an AC voltage according to an exemplary embodiment of the present invention.

A system for estimating the RMS of the AC voltage 10 according to exemplary embodiments, as illustrated in FIG. 4, may include an AC voltage supply 15 configured to supply the AC voltage 10, the rectifier 20 configured to rectify the AC voltage 10 and the controller 30 configured to derive a delayed AC voltage by delaying the rectified AC voltage 10 by a preset delay time and estimate the RMS of the AC voltage based on the rectified AC voltage 10 and the delayed AC voltage 10. The controller 30 may estimate the RMS of the AC voltage using the following equation as described above.

$$V_{RMS} = \sqrt{(2*(V_{AC}^2 * (V_{AC} \angle 45°)^2))}$$

wherein $V_{RMS}$ is the estimation value of the RMS of the AC voltage 10 and $V_{AC}$ is the rectified AC voltage 10.

In particular, as compared with the conventional RMS estimation method, delay of a response time for RMS estimation caused by a filter may be prevented by the omission of the filter. The AC voltage may be used to rapidly and more accurately estimate the RMS of an AC voltage. Accordingly, the efficiency of a power supply using the AC voltage may be improved. Particularly, in a charger for charging a battery etc. by converting the AC voltage into a DC voltage, a charging time and a charging cost may be significantly improved relative to that in the related art.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of estimating a root mean square (RMS) of an alternating current (AC) voltage for a charging device configured to charge a high-voltage battery of a vehicle, the method comprising:
   rectifying, by a rectifier, the AC voltage;
   deriving, by a processor, a delayed AC voltage by delaying the rectified AC voltage;
   estimating, by the processor, the RMS of the AC voltage using the rectified AC voltage and the delayed AC voltage; and
   adjusting, by the processor, the charging device which uses the AC voltage to charge the high-voltage battery of the vehicle based on the estimated RMS of the AC voltage,
   wherein the deriving the delayed AC voltage includes:
      deriving, by the processor, a frequency of the rectified AC voltage;
      deriving, by the processor, a delay time based on the frequency; and
      deriving, by the processor, the delayed AC voltage by delaying the rectified AC voltage by the delay time,
   wherein the deriving the delay time includes deriving, by the processor, the delay time using an equation indicated below:

$T_d = 1/(4 * F_{AC})$, wherein $T_d$ is the delay time, and $F_{AC}$ is the frequency of the rectified AC voltage, and
   wherein the estimating the RMS of the AC voltage includes compensating, by the processor, the delay time attributed to a response delay.

2. The method according to claim 1, further comprising:
   scaling, by the processor, the rectified AC voltage a number of times equal to a predetermined constant.

3. The method according to claim 1, wherein the estimating the RMS of the AC voltage further includes:
   deriving, by the processor, the square of the delayed AC voltage and the square of the rectified AC voltage;
   multiplying, by the processor, the square of the delayed AC voltage by the square of the rectified AC voltage; and
   estimating, by the processor, the RMS of the AC voltage by multiplying a predetermined transform constant by the multiplied result.

4. The method according to claim 3, wherein the transform constant is $\sqrt{2}$.

5. A system for estimating a root mean square (RMS) of an alternating current (AC) voltage for a charging device configured to charge a high-voltage battery of a vehicle, the system comprising:
   an AC voltage supply configured to supply the AC voltage;
   a rectifier configured to rectify the AC voltage; and
   a processor configured to derive a delayed AC voltage by delaying the rectified AC voltage, to estimate the RMS of the AC voltage using the rectified AC voltage and the delayed AC voltage, and to adjust the charging device which uses the AC voltage to charge the high-voltage battery of the vehicle based on the estimated RMS of the AC voltage,
   wherein the processor is further configured to derive a frequency of the rectified AC voltage, a delay time based on the frequency, and the delayed AC voltage by delaying the rectified AC voltage by the delay time,
   wherein the processor is further configured to derive the delay time using an equation indicated below:

$T_d = 1/(4 * F_{AC})$, wherein $T_d$ is the delay time, and $F_{AC}$ is the frequency of the rectified AC voltage, and
   wherein the processor is further configured to estimate the RMS of the AC voltage by compensating the delay time attributed to a response delay.

6. The system according to claim 5, further comprising a transform having a constant of $\sqrt{2}$.

* * * * *